United States Patent
Matsuura

(10) Patent No.: US 8,223,883 B2
(45) Date of Patent: Jul. 17, 2012

(54) TRANSMISSION CIRCUIT, METHOD FOR DETERMINING DELAY TIME USED IN THE TRANSMISSION CIRCUIT, AND COMMUNICATION APPARATUS USING THE TRANSMISSION CIRCUIT

(75) Inventor: Toru Matsuura, Osaka (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 12/512,486

(22) Filed: Jul. 30, 2009

(65) Prior Publication Data

US 2010/0027445 A1 Feb. 4, 2010

(30) Foreign Application Priority Data

Aug. 1, 2008 (JP) ................................ 2008-199980

(51) Int. Cl.
*H04L 27/00* (2006.01)
(52) U.S. Cl. ........ 375/295; 375/296; 375/297; 375/300; 375/235
(58) Field of Classification Search .................. 375/295, 375/296, 297, 300, 235; 455/102, 126
See application file for complete search history.

(56) References Cited

U.S. PATENT DOCUMENTS

| 7,573,949 | B2 * | 8/2009 | Matsuura et al. | 375/295 |
| 7,894,545 | B1 * | 2/2011 | Groe | 375/295 |
| 2006/0234652 | A1 | 10/2006 | Oka | |
| 2007/0129032 | A1 * | 6/2007 | Matsuura et al. | 455/127.2 |
| 2008/0112506 | A1 * | 5/2008 | Strong | 375/300 |

FOREIGN PATENT DOCUMENTS

| WO | 2006/101094 | 9/2006 |
| WO | WO 2006/118317 | * 11/2006 |

* cited by examiner

*Primary Examiner* — Dhaval Patel
(74) *Attorney, Agent, or Firm* — Wenderoth, Lind & Ponack, L.L.P.

(57) ABSTRACT

An amplitude signal and a frequency signal are generated through processing of data. The frequency signal is angle modulated. The amplitude signal is adjusted based on a delay time and is amplitude amplified. The resultant signal from the angle modulation is amplitude modulated based on the resultant signal from the amplitude amplification to obtain a modulated signal. The modulated signal is used to calculate a delay between the amplitude signal and the frequency signal, which is used for feedback control of the delay time by which the amplitude signal is adjusted until no delay exists only in a test period. Through the signal generating, a sinusoidal signal is outputted as each of the amplitude signal and the frequency signal during the test period.

10 Claims, 13 Drawing Sheets

F I G. 9
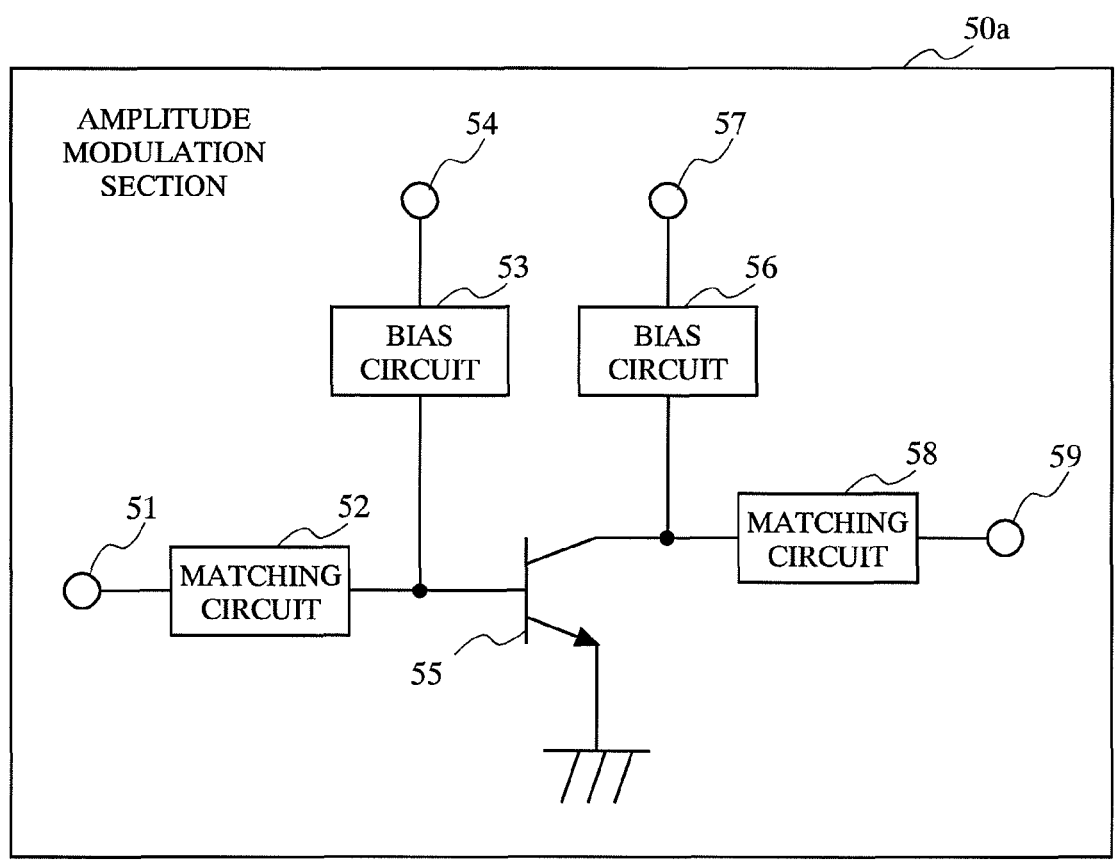

F I G. 1 2
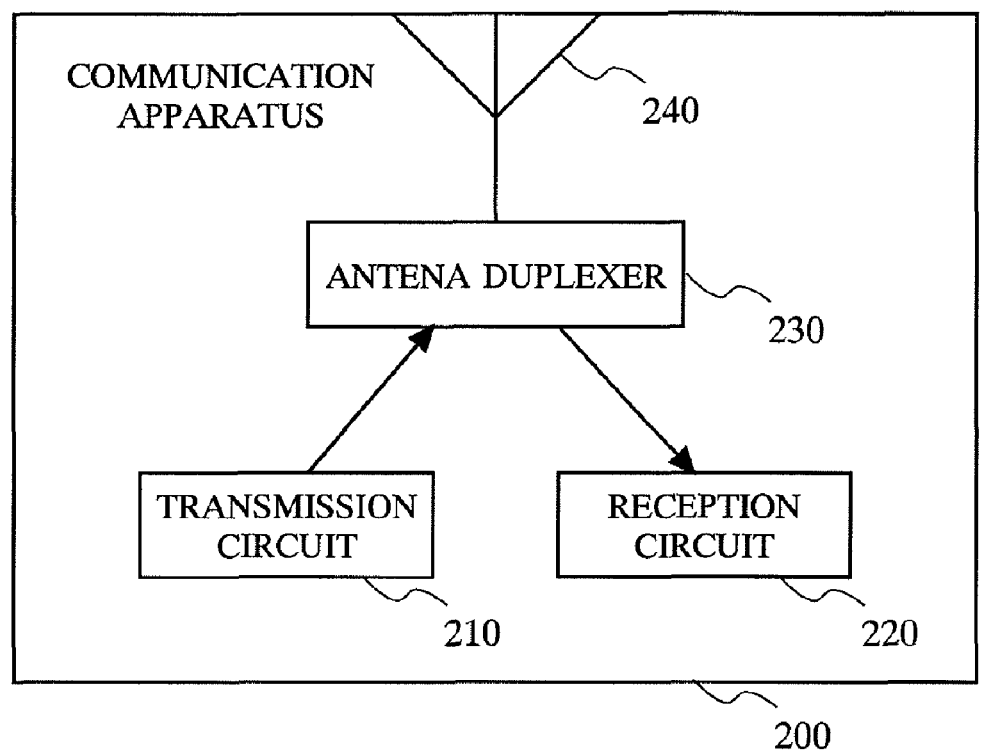

TRANSMISSION CIRCUIT, METHOD FOR DETERMINING DELAY TIME USED IN THE TRANSMISSION CIRCUIT, AND COMMUNICATION APPARATUS USING THE TRANSMISSION CIRCUIT

BACKGROUND OF THE INVENTION

1. Field of the Invention

The present invention relates to a transmission circuit for generating a transmission signal in polar modulation method, a method for controlling a delay time used in the transmission circuit, and a communication apparatus using the transmission circuit.

2. Description of the Background Art

Conventionally, a class A or a class AB linear amplifier is used for a radio-frequency power amplifier for amplifying a modulation signal containing an envelope variation component, thereby linearly amplifying the envelope variation component. While such a linear amplifier is excellent in linearity, the linear amplifier needs to constantly consume power due to a DC bias current flowing therethrough, and therefore the power efficiency of the liner amplifier is reduced as compared to a class C or Class E non-linear amplifier, and the like. Therefore, when such a radio-frequency power amplifier is used for a hand-held communication apparatus using a battery as a power supply, increased power consumption of the radio frequency power amplifier shortens its usable life. Further, when such a radio frequency power amplifier is applied to a base station apparatus of a wireless system including a plurality of high-power transmission circuits, the size of the apparatus and heat generation are increased.

As a transmission circuit which operates with enhanced efficiency, a transmission circuit to which a polar modulation method is applied is conventionally suggested. FIG. 13 is a block diagram illustrating a configuration of a conventional transmission circuit 500 to which the polar modulation method is applied. In FIG. 13, the conventional transmission circuit 500 includes a signal generation section 510, an amplitude amplification section 530, an angle modulation section 540, and an amplitude modulation section 550.

The signal generation section 510 outputs an amplitude signal and a frequency signal based on an amplitude component and a phase component, respectively, which are obtained through signal processing of input data. The frequency signal is a signal obtained by differentiating a phase with respect to a time. The amplitude signal is inputted to the amplitude amplification section 530, and the frequency signal is inputted to the angle modulation section 540. The amplitude amplification section 530 supplies, to the amplitude modulation section 550, a voltage based on the inputted amplitude signal. The angle modulation section 540 performs angle modulation of the inputted frequency signal to generate an angle-modulated signal, and outputs the angle-modulated signal to the amplitude modulation section 550. The amplitude modulation section 550 amplitude-modulates the angle-modulated signal which is outputted by the angle modulation section 540, by the voltage supplied from the amplitude amplification section 530, and outputs the obtained signal as a modulated signal. The modulated signal is outputted as a transmission signal.

Thus, the conventional transmission circuit 500 to which the polar modulation method is applied separately processes the amplitude signal and the frequency signal, thereby realizing a highly efficient transmission circuit in which distortion is reduced.

The conventional transmission circuit 500 processes the amplitude signal and the frequency signal which are transmitted through separate paths, respectively. Therefore, a time at which the amplitude signal arrives at the amplitude modulation section 550 may be different from a time at which the frequency signal arrives at the amplitude modulation section 550. The difference in time causes distortion the transmission signal outputted by the amplitude modulation section 550.

Therefore, a transmission circuit capable of eliminating the difference in time is suggested in WO2006/101094 (Patent Document 1). FIG. 14 shows a conventional transmission circuit 600 disclosed in Patent Document 1. The conventional transmission circuit 600 shown in FIG. 14 includes a signal generation section 610, a delay time adjustment section 620, an amplitude amplification section 630, an angle modulation section 640, an amplitude modulation section 650, and a delay control section 660.

The signal generation section 610 generates, as a test signal for adjusting a delay time, a sinusoidal in-phase component modulation signal (I signal; sin ωt) and a sinusoidal quadrature component modulation signal (Q signal; sin(ωt+θ0)), and generates an amplitude component modulation signal and a phase component modulation signal based on the IQ signals. Delay amounts of the amplitude component modulation signal and the phase component modulation signal are adjusted by the delay time adjustment section 620. Thereafter, the amplitude component modulation signal and the phase component modulation signal each of which has its delay amount adjusted are inputted to the amplitude amplification section 630 and the angle modulation section 640, respectively, and are modulated by the amplitude modulation section 650. The delay control section 660 detects a difference in time between the amplitude component modulation signal and the phase component modulation signal, based on a transmission signal outputted by the amplitude modulation section 650, and controls the delay time which is necessary in the delay time adjustment section 620, based on the detected difference in time.

The use of the configuration of the conventional transmission circuit 600 as described above enables elimination of the difference in delay time between the amplitude signal and the phase signal, and also enables the transmission signal having no distortion to be outputted from the amplitude modulation section 650. However, in the technique of the conventional transmission circuit 600, test signals in IQ regions are used, thereby widening bands of the test signals (FIG. 15). The conventional transmission circuit has such a problem.

When the respective configurations of the delay time adjustment section 620, the amplitude amplification section 630, the angle modulation section 640, the amplitude modulation section 650, and the delay control section 660, which are provided following the signal generation section 610, are designed for a sufficiently wide band, there is no problem. However, when at least any one of the configurations is not designed sufficiently for a pass band, a distortion is generated in the test signal, thereby reducing control accuracy for adjusting the delay time.

SUMMARY OF THE INVENTION

Therefore, an object of the present invention is to provide a transmission circuit capable of accurately adjusting a difference in delay time between an amplitude signal and a phase signal without using a circuit configuration designed for a wide band, a method for controlling a delay time used in the transmission circuit, and a communication apparatus using the transmission circuit.

The present invention is directed to a transmission circuit that generates a transmission signal based on inputted data, and outputs the transmission signal. In order to attain the object mentioned above, the transmission circuit of the present invention includes: a signal generation section; an angle modulation section; a delay time adjustment section; an amplitude amplification section; an amplitude modulation section; and a delay processing circuit.

The signal generation section generates an amplitude signal and one of a frequency signal and a phase signal, based on an amplitude component and a phase component, respectively, both of which are obtained through signal processing of the inputted data. The angle modulation section performs angle modulation of the one of the frequency signal and the phase signal. The delay time adjustment section adjusts a delay time of the amplitude signal. The amplitude amplification section outputs a signal based on a magnitude of the amplitude signal having the delay time adjusted. The amplitude modulation section amplitude-modulates a signal outputted by the angle modulation section, by the signal outputted by the amplitude amplification section, and outputs an obtained signal as a modulated signal. The delay processing circuit calculates a delay time difference $\theta$ between the amplitude signal and the one of the frequency signal and the phase signal, based on the modulated signal, and performs feedback control for the delay time which is to be adjusted by the delay time adjustment section such that the delay time difference $\theta$ is reduced, during only a predetermined test period. The signal generation section outputs a sinusoidal signal as each of the amplitude signal and the one of the frequency signal and the phase signal during the predetermined test period.

It is preferable that, when $\omega_m$ represents an angular frequency of the sinusoidal signal, $\omega_0$ represents an angular frequency of a carrier signal, and A, B, $\alpha$, and $\beta_0$ each represent a constant, the signal generation section outputs a sinusoidal signal $A(1+\alpha \cos \omega_m t)$ as the amplitude signal, and outputs a sinusoidal signal $B(\omega_0+\beta_0 \cos \omega_m t)$ as the frequency signal.

In this case, a value which prevents the sinusoidal signal for each of the amplitude signal and the one of the frequency signal and the phase signal from being attenuated in paths from the signal generation section to the amplitude modulation section is set as the angular frequency $\omega_m$. Further, it is preferable that the signal generation section outputs the sinusoidal signal indicative of a lesser value at the angular frequency $\omega_m$, and the sinusoidal signal indicative of a greater value at the angular frequency $\omega_m$. Furthermore, it is preferable that, when A, B, $\alpha$, and $\beta_0$ are each set as the constant such that a level of a sideband wave is minimized at an angular frequency $\omega_0-\omega_m$ of the transmission signal or at an angular frequency $\omega_0+\omega_m$ of the transmission signal when the delay time difference $\theta$ between the amplitude signal and the frequency signal is zero. Preferably, the amplitude amplification section is one of a series regulator or a switching regulator. Further, the predetermined test period may include one of at least a time period immediately after the transmission circuit is powered on, and a time period before data transmission is really started.

In addition, the present invention is directed to a communication apparatus including the transmission circuit described above. The communication apparatus includes any of the transmission circuits, described above, operable to generate the transmission signal, and an antenna operable to output the transmission signal generated by the transmission circuit. Further, the communication apparatus may include a reception circuit operable to process a reception signal received from the antenna; and an antenna duplexer operable to output, to the antenna, the transmission signal generated by the transmission circuit, and output, to the reception circuit, the reception signal received from the antenna. Further, according to the present invention, it is also possible to provide, as a method for determining a delay time used in the transmission circuit, the process steps performed by the respective components by using a sinusoidal signal during the predetermined test period.

According to the present invention, sinusoidal signals in amplitude/phase regions are used as test signals. Therefore, even when the respective components of the circuit are not designed for a wide band, the delay time of the amplitude signal can be adjusted so as to be the same as the delay time of the frequency signal.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a diagram illustrating in detail an exemplary configuration of an amplitude modulation section 50*a*;

FIG. 12 is a diagram illustrating a configuration of a communication apparatus 200 according to one embodiment of the present invention;

DETAILED DESCRIPTION OF THE INVENTION

Figure 1:
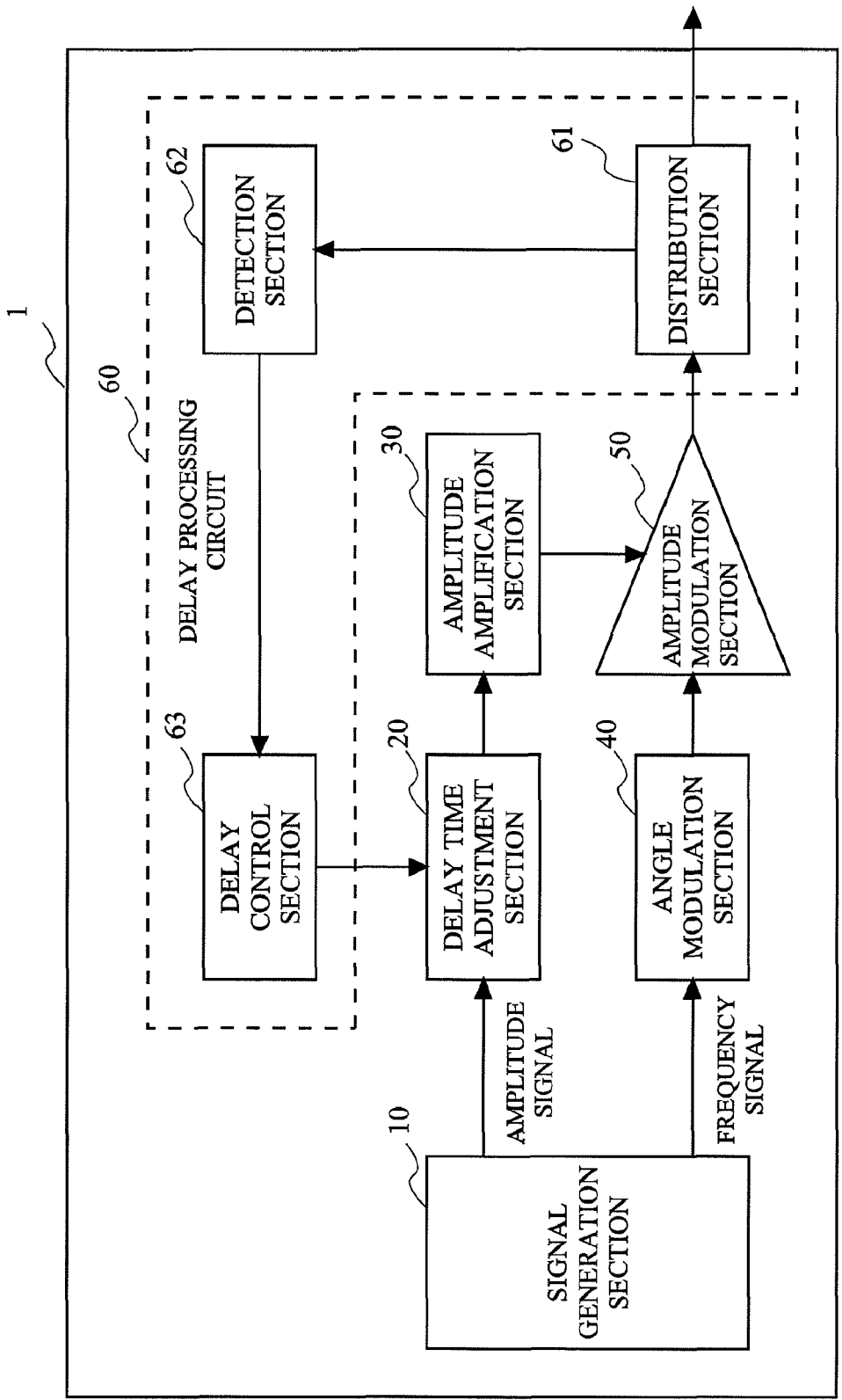
FIG. 1 is a diagram illustrating a configuration of a transmission circuit 1 according to one embodiment of the present invention.

FIG. 1 is a diagram illustrating a configuration of a transmission circuit 1 according to one embodiment of the present invention. In FIG. 1, the transmission circuit 1 of the present invention includes: a signal generation section 10; a delay time adjustment section 20; an amplitude amplification section 30; an angle modulation section 40; an amplitude modulation section 50; and a delay processing circuit 60. The delay processing circuit 60 includes a distribution section 61, a detection section 62, and a delay control section 63.

The signal generation section 10 outputs an amplitude signal and a frequency signal, based on an amplitude component and a phase component, respectively, which are obtained through signal processing of input data. The frequency signal is a signal obtained by differentiating a phase with respect to a time. Further, the signal generation section 10 outputs a sinusoidal signal described below as each of the amplitude signal and the frequency signal during a predetermined test period.

A delay time of the amplitude signal is adjusted by the delay time adjustment section 20, and is then inputted to the amplitude amplification section 30. The amplitude amplification section 30 outputs a signal which is controlled based on the inputted amplitude signal. The amplitude amplification section 30 typically outputs a signal which is proportional, in magnitude, to the inputted amplitude signal. The signal outputted by the amplitude amplification section 30 is inputted to the amplitude modulation section 50. The frequency signal is inputted to the angle modulation section 40 and angle-modulated by the angle modulation section 40. The angle-modulated frequency signal is inputted to the amplitude modulation section 50. The amplitude modulation section 50 amplitude-modulates the signal inputted from the angle modulation section 40 by the signal inputted from the amplitude amplification section 30, and outputs the modulated signal as a transmission signal.

Hereinafter, with reference to FIGS. 2 to 5, delay time adjustment processing performed by the transmission circuit 1 of the present invention will be described.

Initially, a principle of the present invention will be described. The signal generation section 10 of the present invention uses, as test signals, a sinusoidal amplitude signal obtained through the following equation [1] and a sinusoidal frequency signal obtained through the following equation [2], during a test period.

amplitude signal: $A(1+\alpha \cos \omega_m t)$      [1]

frequency signal: $B(\omega_0+\beta_0 \cos \omega_m t)$      [2]

where $\omega_m$ represents an angular frequency of a sinusoidal signal, $\omega_0$ represents an angular frequency of a carrier signal, and A, B, $\alpha$, and $\beta_0$ are each a constant.

As is well known, when the amplitude signal $(1+\alpha \cos \omega_m t)$ is amplitude-modulated by a carrier signal $\cos \omega_0$, the following equation [3] is obtained.

$$(1 + \alpha\cos\omega_m t)\cos\omega_0 t = \cos\omega_0 t + \frac{\alpha}{2}\{\cos(\omega_0 - \omega_m)t + \cos(\omega_0 + \omega_m)t\} \quad [3]$$

Figure 2:
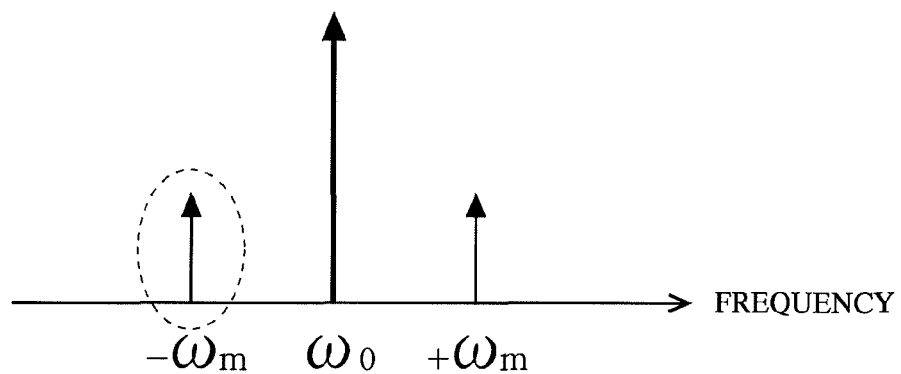
FIG. 2 is a diagram illustrating an exemplary frequency spectrum of an amplitude modulation signal.

When equation [3] is represented as a frequency spectrum, sidebands representing positive values appear at $\pm\omega_m$ with the angular frequency $\omega_0$ being centered therebetween (FIG. 2).

Further, when the frequency signal $(\omega_0+\beta_0 \cos \omega_m t)$ is angle-modulated, that is, integrated with respect to a time, the following equation [4] is obtained.

$$\cos\left(\int_0^t (\omega_0 + \beta_0\cos\omega_m t)\, dt\right) = \cos(\omega_0 t + \beta\sin\omega_m t)$$

$$= \cos\omega_0 t \cos(\beta\sin\omega_m t) -$$

$$\sin\omega_0 t \sin(\beta\sin\omega_m t)$$

$$= J_0(\beta)\cos\omega_0 t +$$

$$\sum_k \{J_k(\beta)\cos(\omega_0 + k\omega_m)t +$$

$$J_{-k}(\beta)\cos(\omega_0 - k\omega_m)t\}$$

Figure 3:
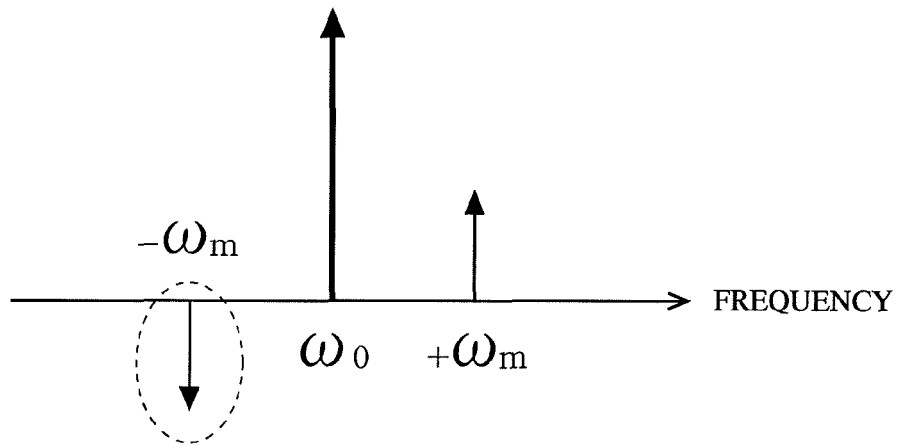
FIG. 3 is a diagram illustrating an exemplary frequency spectrum of a frequency modulation signal.

When equation [4] is represented as a frequency spectrum, a sideband representing a negative value appears at $-\omega_m$, and a sideband representing a positive value appears at $+\omega_m$, with the angular frequency $\omega_0$ being centered therebetween (FIG. 3). The equation indicates that the sidebands endlessly appear at $\pm 2\omega_m$, $\pm 3\omega_m$, . . . . In practice, however, sidebands which are great enough to influence the frequency signal are only sidebands which appear when "k=1" is satisfied. Therefore, FIG. 4 almost represents the state shown in FIG. 3.

As described above, the amplitude modulation signal and the frequency modulation signal indicate values, respectively, having symbols opposite to each other at the angular frequency $\omega_0-\omega_m$. Therefore, when constants are optimized in advance such that an amplitude of the amplitude modulation signal at the angular frequency $\omega_0-\omega_m$ has the same absolute value as an amplitude of the frequency modulation signal at the angular frequency $\omega_0-\omega_m$ (see the following equation [5]), the amplitudes observed at the angular frequency $\omega_0-\omega_m$ cancel each other in the case of the delay times being the same therebetween (the phases being the same therebetween), so that the amplitudes do not appear on the frequency spectrum.

$$\frac{\alpha}{2} = J_1(\beta) \text{ or } \frac{\alpha}{2} = J_{-1}(\beta) \quad [5]$$

According to the present invention, based on this principle, a characteristic sinusoidal signal is inputted as each of the amplitude signal and the frequency signal, so as to correct a difference between the delay time generated in the amplitude modulation path and the delay time generated in the frequency modulation path.

Figure 4:
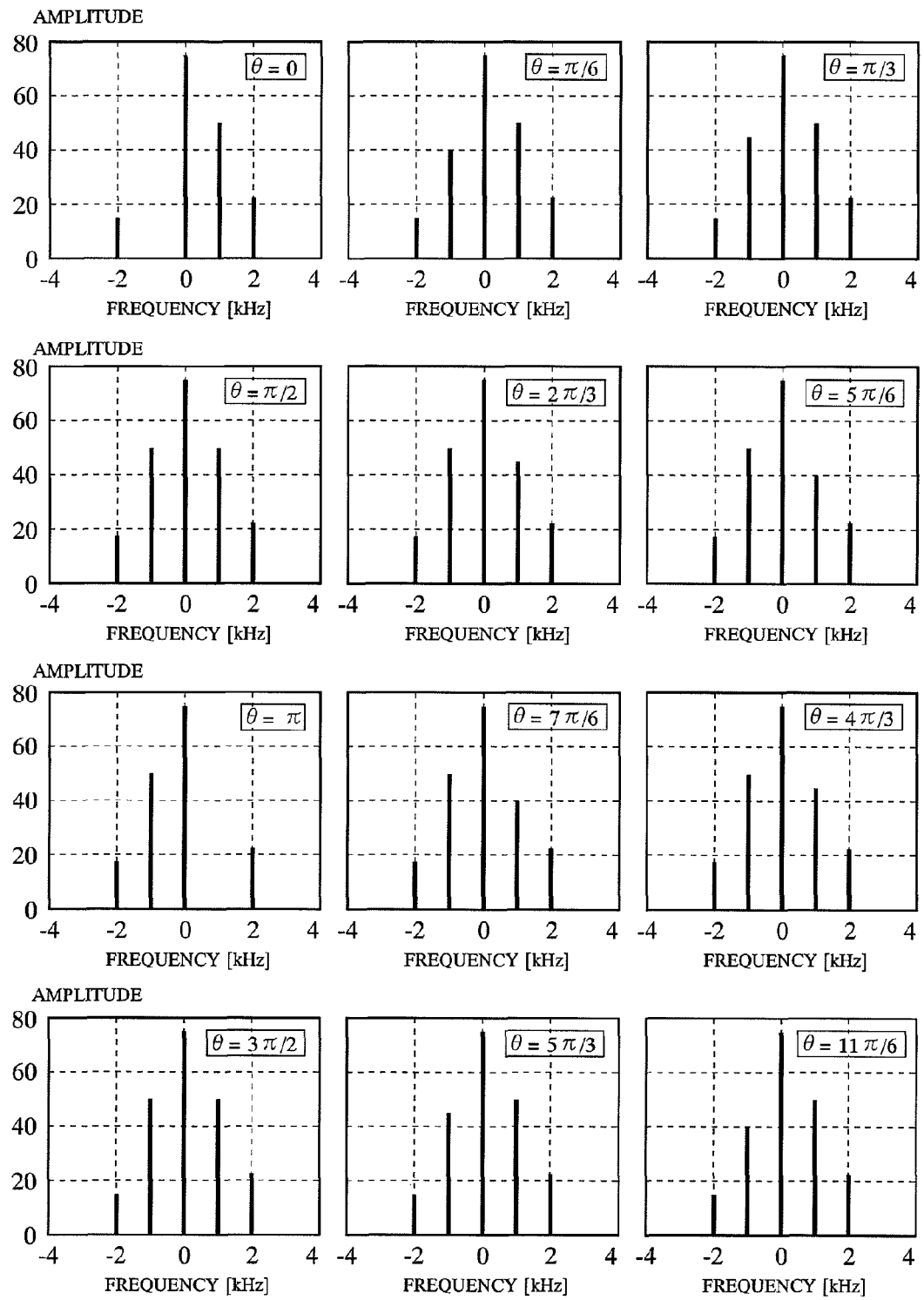
FIG. 4 is a diagram illustrating an exemplary frequency spectrum of a transmission signal outputted from the transmission circuit 1.
Figure 5:
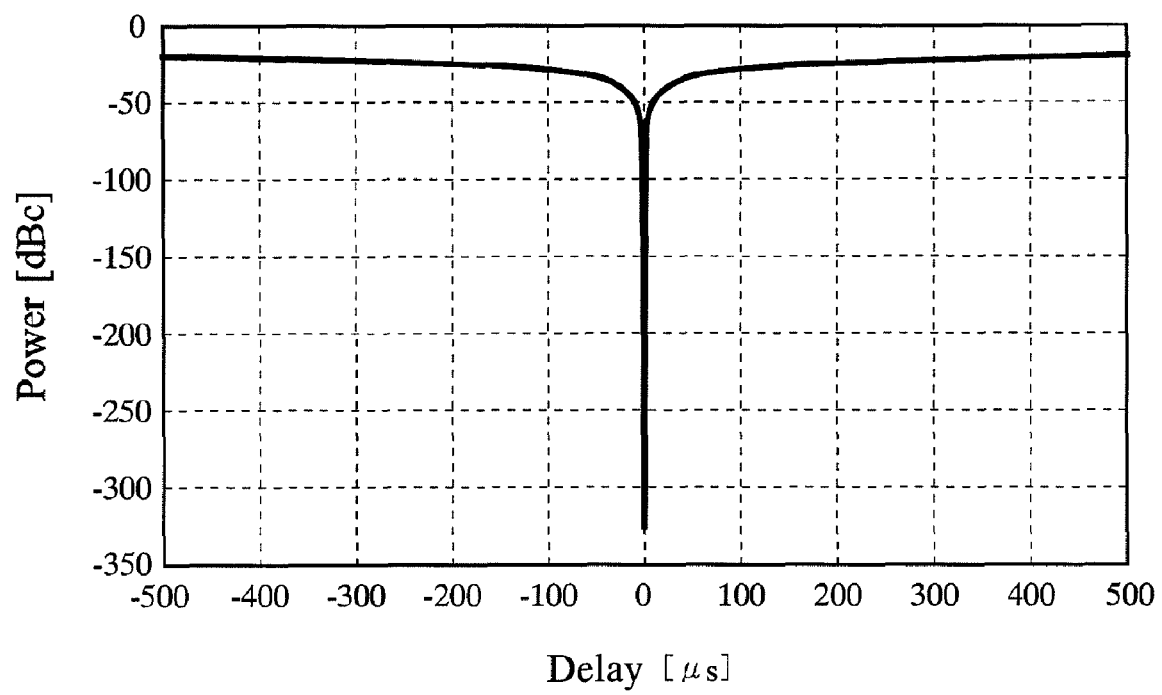
FIG. 5 is a diagram illustrating an exemplary relationship between a delay time in the transmission circuit 1 and an amplitude of an angular frequency $\omega_0-\omega_m$.

FIG. 4 shows a simulation of a frequency spectrum of the transmission signal obtained when the sinusoidal wave of $f=\omega_m/2\pi=1$ kHz is used. FIG. 5 shows a simulation of a relationship between a delay time and an amplitude of the angular frequency $\omega_0-\omega_m$. As shown in FIGS. 4 and 5, when the difference in delay time does not occur ($\theta=0$), an amplitude is cancelled at the angular frequency $\omega_0-\omega_m$. A level at the angular frequency $\omega_0+\omega_m$ is adjusted so as to be minimized by reversing a symbol of any one of the amplitude signal and the frequency signal, thereby minimizing the difference in delay time.

When the angular frequency $\omega_m$ of the sinusoidal signal represents a too small value, a sensitivity for change of a sideband which is caused by the delay is deteriorated, thereby reducing an accuracy for adjustment, whereas when the angular frequency $\omega_m$ of the sinusoidal signal represents a too large value, a frequency band of a circuit configuration causes attenuation of a sideband, and the sideband does not appear as described in the conventional art. Therefore, the angular frequency $\omega_m$ of the sinusoidal signal is preferably set in consideration of the above-described two viewpoints. The angular frequency $\omega_m$ of the sinusoidal signal may be typically set as a maximum frequency at which the sinusoidal signal is able to pass through a circuit configuration.

Further, the angular frequency $\omega_m$ of the sinusoidal signal may not necessarily be set as one fixed value. For example, firstly, the delay time is roughly adjusted by using the angular frequency $\omega_m$ of a lesser value, and thereafter fine adjustment of the delay time may be performed by using the angular frequency $\omega_m$ of a greater value. Thus, the delay time can be accurately adjusted in a short time period.

Next, an operation performed by the transmission circuit 1 of the present invention will be described.

The transmission circuit 1 starts the following process during a predetermined test period. The predetermined test period may be, for example, a time period immediately after the transmission circuit 1 is powered on (CDMA and the like), and a time period before data transmission is really started (TDMA and the like).

The signal generation section 10 outputs the sinusoidal signal obtained through equation [1], as an amplitude signal, to the delay time adjustment section 20. Further, the signal generation section 10 outputs the sinusoidal signal obtained through equation [2], as a frequency signal, to the angle modulation section 40. The delay time of the amplitude signal is adjusted by the delay time adjustment section 20, and the amplitude signal having the delay time adjusted is amplified by the amplitude amplification section 30, and is then inputted to the amplitude modulation section 50. The frequency signal is angle-modulated by the angle modulation section 40, and is then inputted to the amplitude modulation section 50. The amplitude modulation section 50 amplitude-modulates the signal inputted from the angle modulation section 40 by the signal inputted from the amplitude amplification section 30, and outputs the modulated signal as a transmission signal.

The distribution section 61 distributes the transmission signal outputted by the amplitude modulation section 50, and outputs the distributed transmission signal to the detection section 62. The detection section 62 detects a level of a sideband wave of the received transmission signal at the angular frequency $\omega_0-\omega_m$. The delay control section 63 controls a delay time of the amplitude signal to be adjusted by the delay time adjustment section 20 based on the level of the sideband wave which is detected by the detection section 62 at the angular frequency $\omega_0-\omega_m$ such that the level of the sideband wave is minimized.

Next, configurations of the amplitude amplification section 30 and the amplitude modulation section 50 will be described in detail with reference to FIGS. 6 to 11.

Figure 6:
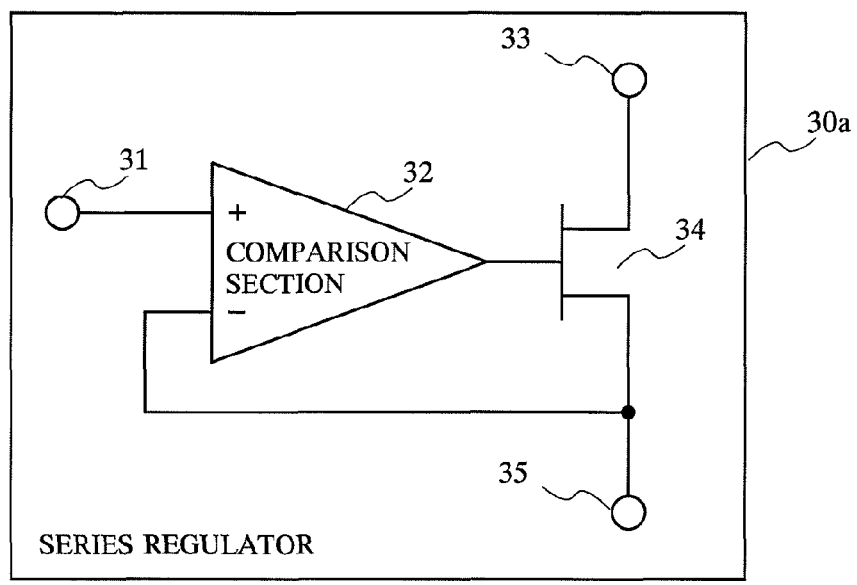
FIG. 6 is a diagram illustrating in detail an exemplary configuration of a regulator 30*a*.

The amplitude amplification section 30 may be configured as, for example, a voltage-driven series regulator 30a as shown in FIG. 6. The series regulator 30a shown in FIG. 6 includes a comparison section 32 and a field-effect transistor (FET) 34. To an input terminal 31, an amplitude signal is inputted through the delay time adjustment section 20. The amplitude signal is inputted to a gate of the FET 34 through the comparison section 32. DC voltage is supplied to a drain of the FET 34 from a power supply terminal 33. The FET 34 outputs, from a source thereof, a voltage proportional to a magnitude of the inputted amplitude signal. The voltage outputted from the source of the FET 34 is fed back to the comparison section 32. The comparison section 32 adjusts the magnitude of the amplitude signal to be inputted to the gate of the FET 34 based on the voltage having been fed back thereto. In such a manner, the series regulator 30a stably supplies from an output terminal 35 the voltage which is controlled based on the magnitude of the amplitude signal. The FET 34 may be replaced with a bipolar transistor.

Figure 7:
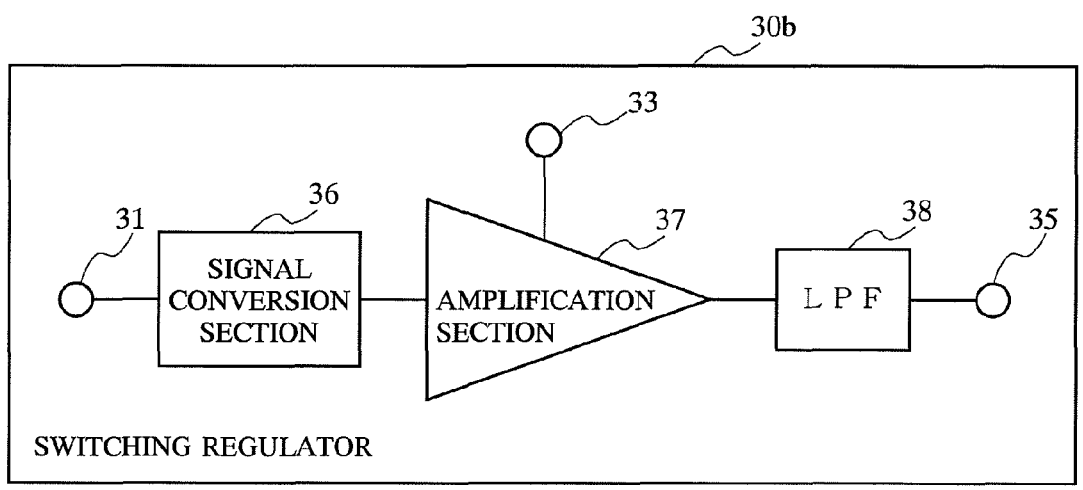
FIG. 7 is a diagram illustrating in detail an exemplary configuration of a regulator 30*b*.

Further, the amplitude amplification section 30 may be configured as, for example, a voltage-driven switching regulator 30b as shown in FIG. 7. The switching regulator 30b shown in FIG. 7 includes a signal conversion section 36, an amplification section 37, and a low-pass filter (LPF) 38. To an input terminal 31, an amplitude signal is inputted through the delay time adjustment section 20. The signal conversion section 36 converts the inputted amplitude signal into a pulse-width modulated (PWM) signal or a delta-sigma modulated signal. The amplification section 37 amplifies the signal obtained through the conversion performed by the signal conversion section 36, and outputs an amplified signal. DC voltage is supplied to the amplification section 37 from a power supply terminal 33. A highly efficient switching amplifier such as a class D amplifier is used for the amplification section 37. The LPF 38 removes a spurious component, such as a quantization noise and a switching noise, from the signal outputted by the amplification section 37. The signal from which the spurious component has been removed by the LPF 38 is outputted to an output terminal 35 as a voltage controlled based on the magnitude of the amplitude signal. In the switching regulator 30b, the signal outputted from the LPF 38 may be fed back to the signal conversion section 36 so as to stabilize an output voltage. When the switching regulator 30b representing a highly efficient performance is used as the amplitude amplification section 30 in the transmission circuit 1, power consumption can be reduced.

Figure 8:
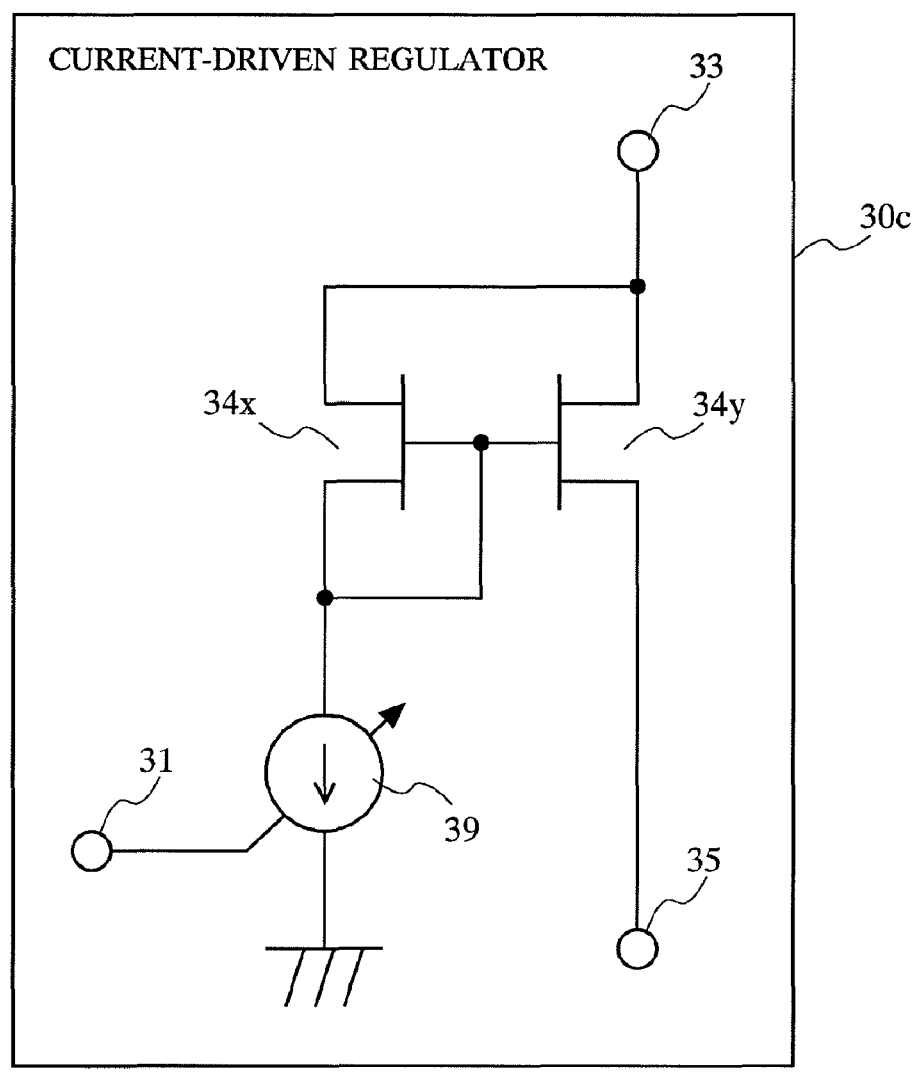
FIG. 8 is a diagram illustrating in detail an exemplary configuration of a regulator 30*c*.

Further, the amplitude amplification section 30 may be configured as, for example, a current-driven regulator 30c as shown in FIG. 8. The current-driven regulator 30c shown in FIG. 8 includes a variable current source 39, a transistor 34x, and a transistor 34y. To an input terminal 31, an amplitude signal is inputted through the delay time adjustment section 20. DC voltage is supplied to a power supply terminal 33. The inputted amplitude signal is outputted, as a current controlled based on the magnitude of the amplitude signal, to an output terminal 35 through the variable current source 39, the transistor 34x, and the transistor 34y. The current-driven regulator 30c as described above is effective when the amplitude modulation section 50 is configured as a bipolar transistor. Each of the transistors 34x and 34y may be a FET or a bipolar transistor. In either case, the same effect can be obtained.

The amplitude modulation section 50 may be, for example, configured as shown in FIG. 9. The amplitude modulation section 50a as shown in FIG. 9 includes a matching circuit 52, a bias circuit 53, a bipolar transistor (BT) 55, a bias circuit 56, and a matching circuit 58. An angle-modulated signal is inputted to an input terminal 51 from the angle modulation section 40. The angle-modulated signal is inputted to a base of the BT 55 through the matching circuit 52. DC voltage is applied to a power supply terminal 54. That is, a bias voltage is supplied to the base of the BT 55 through the power supply terminal 54 and the bias circuit 53. A signal controlled based on the magnitude of the amplitude signal is inputted to an input terminal 57 from the amplitude amplification section 30. The signal controlled based on the magnitude of the amplitude signal is inputted to a collector of the BT 55 through the bias circuit 56. The BT 55 amplitude-modulates the angle-modulated signal by the signal controlled based on the magnitude of the amplitude signal, and outputs the obtained signal as a modulated signal which is obtained through the angle modulation and the amplitude modulation. The modulated signal is outputted by the BT 55 to an output terminal 59 through the matching circuit 58. The BT 55 may be a FET. Further, in the amplitude modulation section 50a, a signal to be inputted to the power supply terminal 54 may be inputted to the input terminal 57, and a signal to be inputted to the input terminal 57 may be inputted to the power supply terminal 54. Also in this case, the same effect can be obtained.

Figure 10:
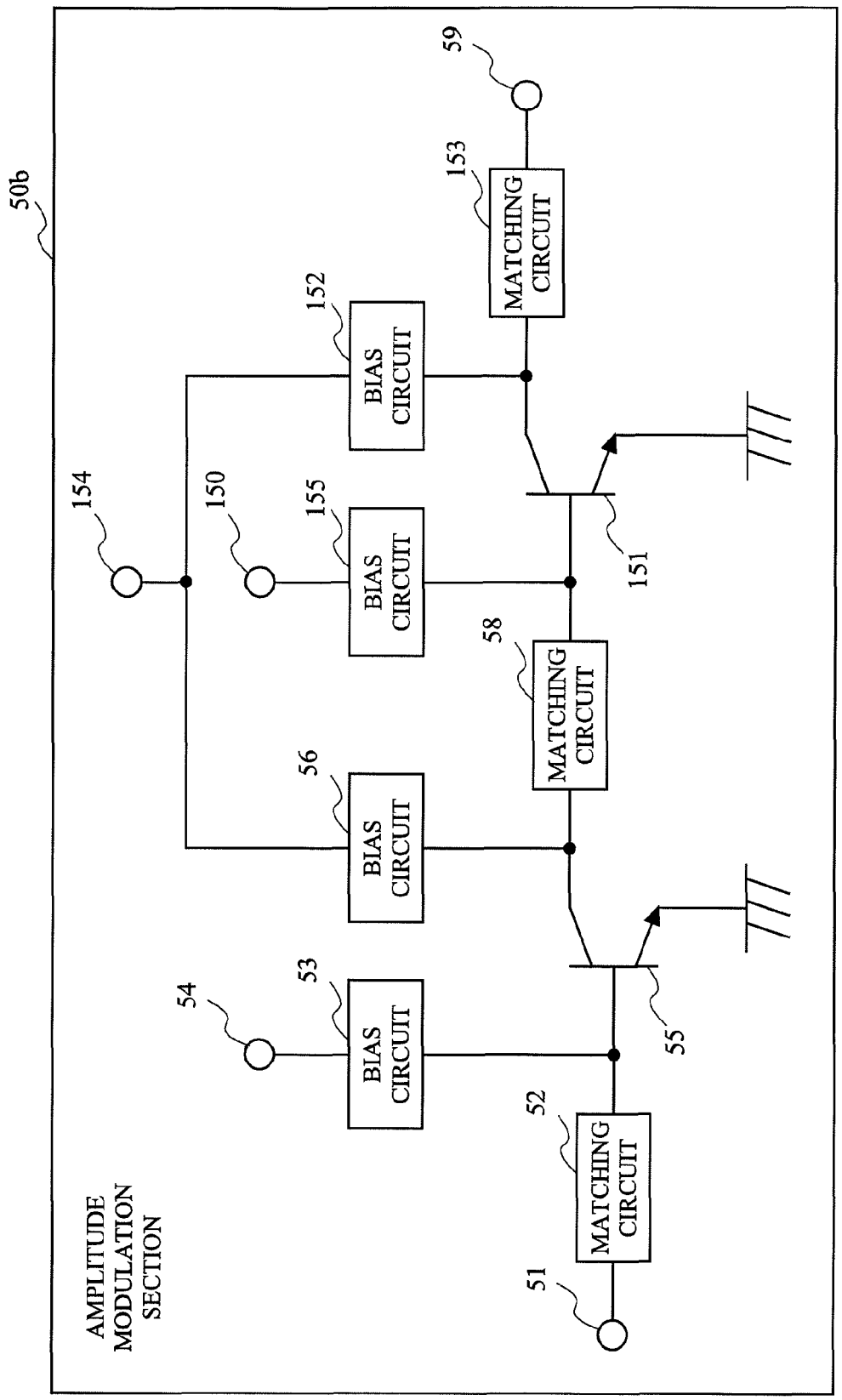
FIG. 10 is a diagram illustrating in detail an exemplary configuration of an amplitude modulation section 50*b*.

The amplitude modulation section 50 may have a configuration different from that of the amplitude modulation section 50a described above. FIG. 10 is a diagram illustrating an exemplary configuration of an amplitude modulation section 50b. The amplitude modulation section 50b basically has a configuration in which two amplitude modulation sections 50a as shown in FIG. 9 are connected in series with each other. A bias voltage is supplied to the base of the BT 55 through the bias circuit 53 from the power supply terminal 54. A bias voltage is supplied to a base of a BT 151 through a bias circuit 155 from a power supply terminal 150. A signal controlled based on the magnitude of the amplitude signal is inputted to the collector of the BT 55 through the bias circuit 56 from the amplitude amplification section 30. Further, a signal controlled based on the magnitude of the amplitude signal is inputted to a collector of the BT 151 through a bias circuit 152 from the amplitude amplification section 30. The amplitude modulation section 50b having this configuration is capable of outputting a signal of an increased dynamic range as compared to the amplitude modulation section 50a shown in FIG. 9. In each of the amplitude modulation sections 50a and 50b, a FET may be used as a transistor instead of a BT.

As described above, in the transmission circuit 1 according to one embodiment of the present invention, sinusoidal signals in amplitude/phase regions are used as test signals. Therefore, even when the respective components of the circuit are not designed for a wide band, the delay time of the amplitude signal can be adjusted so as to be the same as the delay time of the frequency signal.

In general, as compared to a series regulator, a switching regulator represents a highly efficient performance, which is an advantage thereof, and a switching regulator is designed for a narrow band, which is a disadvantage thereof. However, in the transmission circuit 1, sinusoidal signals in amplitude/phase regions are used as test signals, and thus distortion is reduced even when the transmission circuit 1 is designed for a narrow band. Therefore, even for a modulation band which is adaptable only by a series regulator in a conventional art, a highly efficient switching regulator can be used. Accordingly, power consumption can be further reduced.

Figure 11:
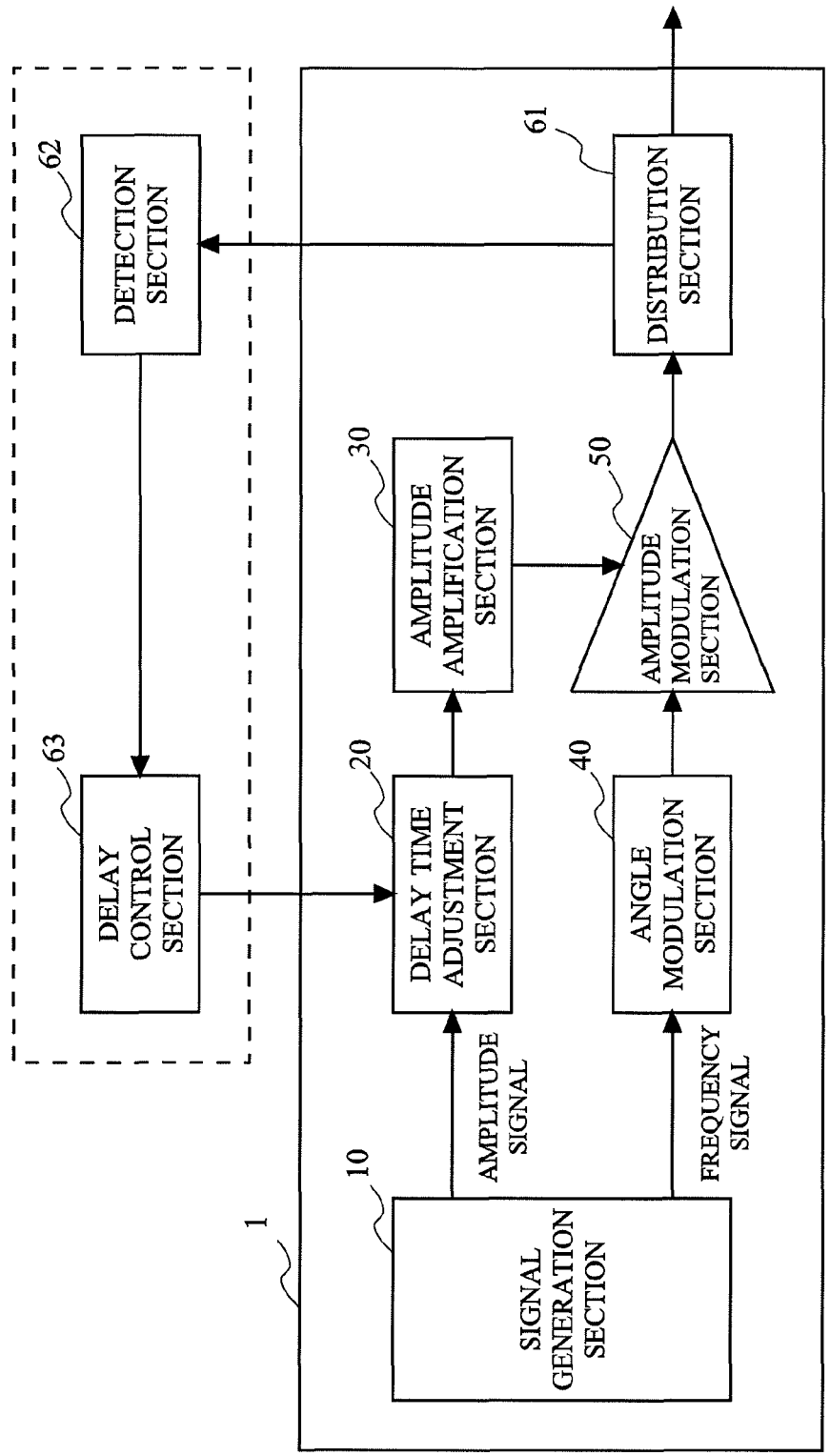
FIG. 11 is a diagram illustrating a configuration of a transmission circuit according to another embodiment of the present invention.
Figure 13:
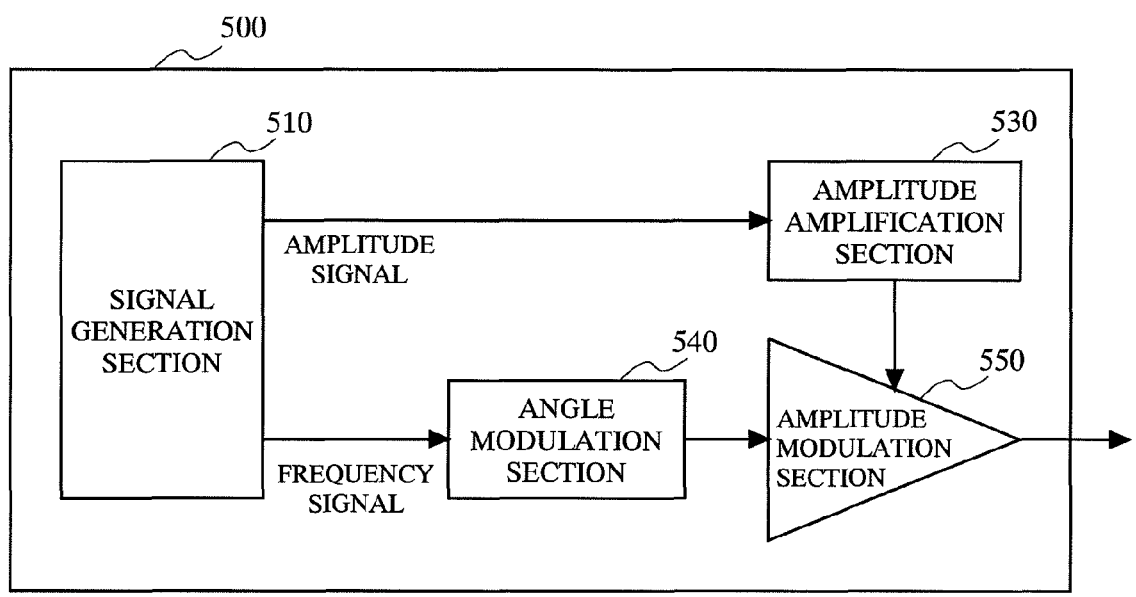
FIG. 13 is a diagram illustrating an exemplary configuration of a conventional transmission circuit 500.
Figure 14:
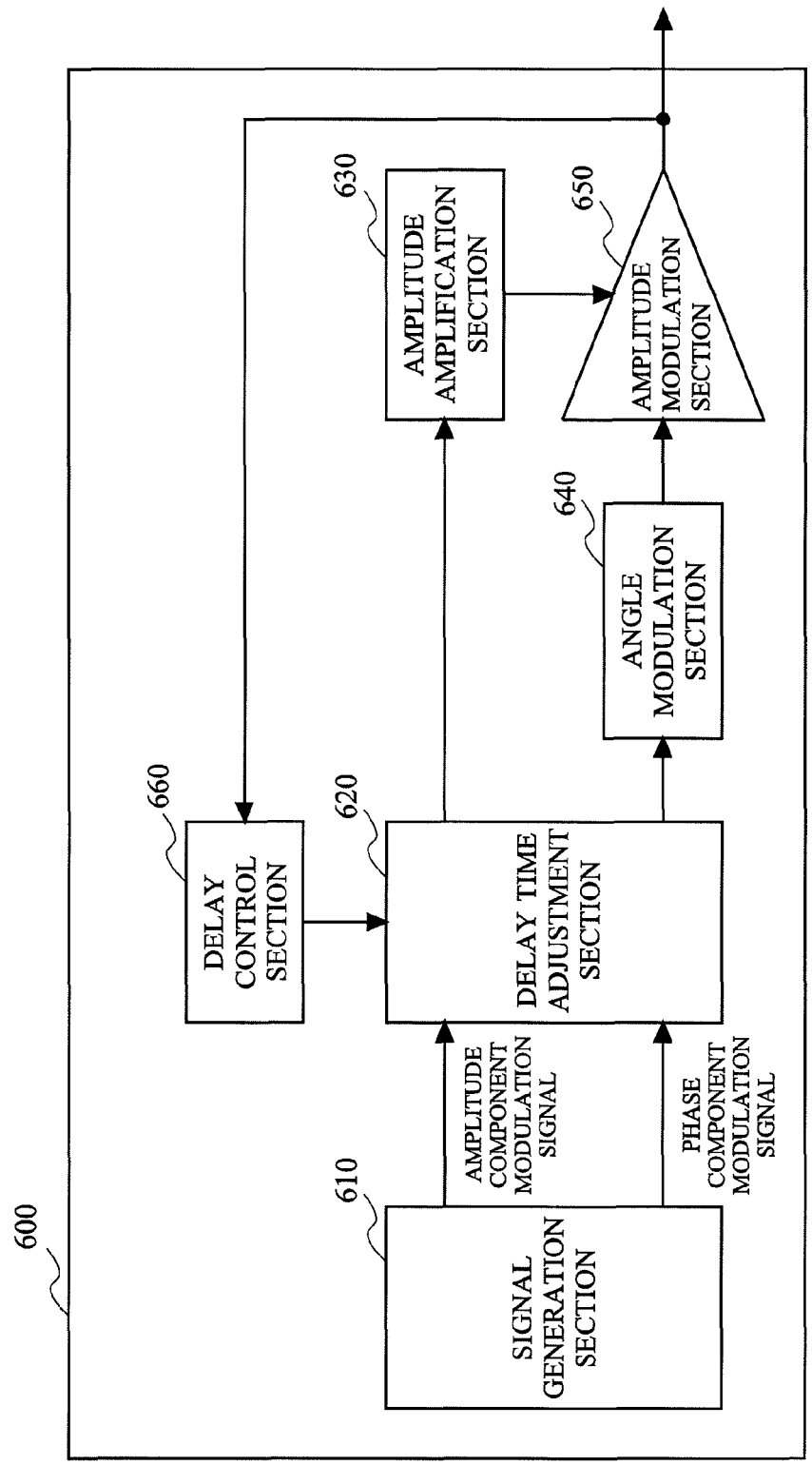
FIG. 14 is a diagram illustrating an exemplary configuration of a conventional transmission circuit 600.
Figure 15:
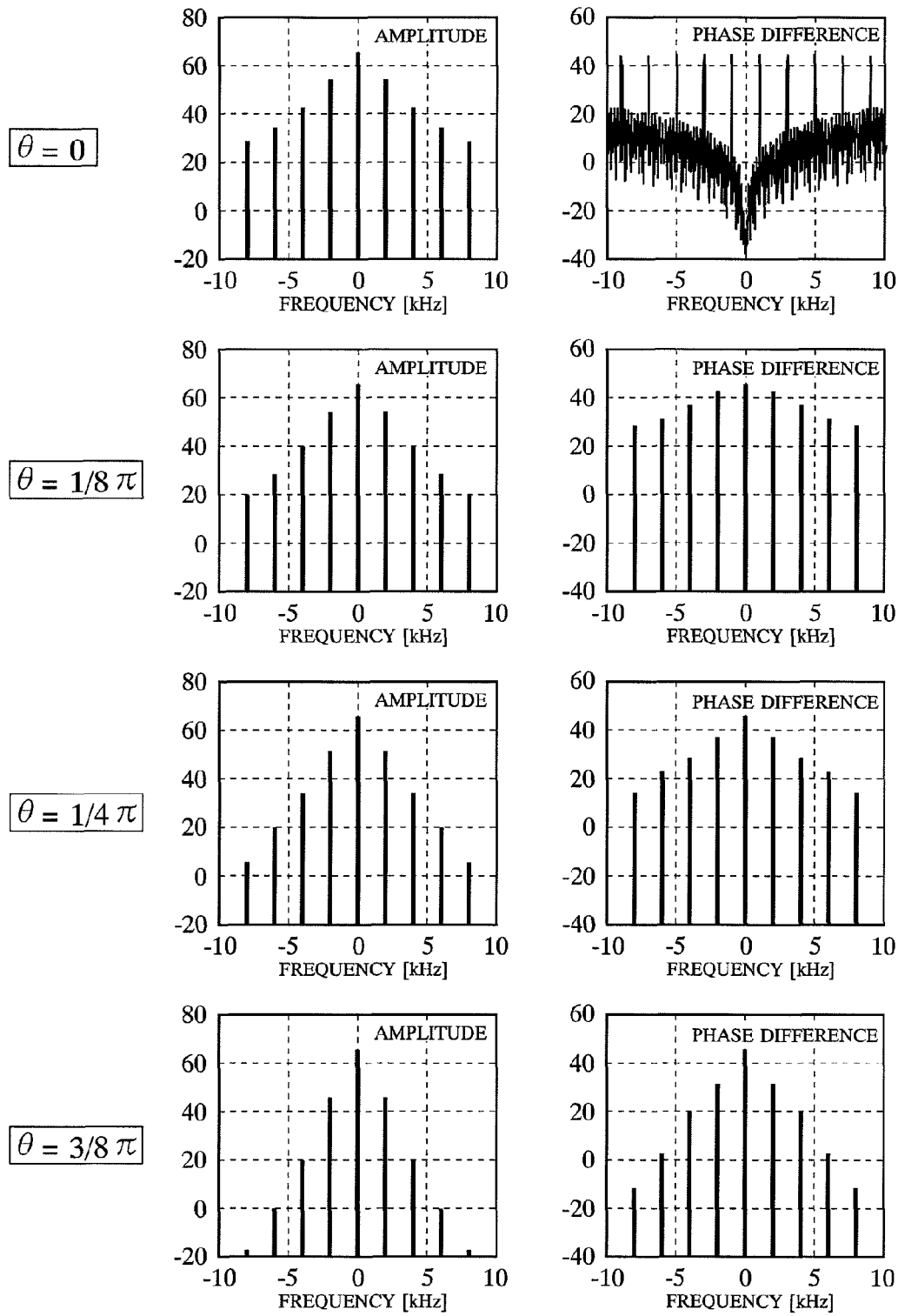
FIG. 15 is a diagram illustrating an exemplary frequency spectrum of a transmission signal outputted from the conventional transmission circuit 600.

Further, the adjustment of the delay time as described above may be performed in the manufacturing process before shipment as well as in a time period immediately after the transmission circuit 1 is powered on or in a time period before the data transmission is really started. In this case (in the manufacturing process), configurations corresponding to the detection section 62 and the delay control section 63 shown in FIG. 1 may be equipped with, for example, an adjustment jig of manufacturing facilities instead of the configurations being incorporated into the transmission circuit 1 which is a final product (FIG. 11).

<Communication Apparatus Using the Transmission Circuit of the Present Invention>

FIG. 12 is a diagram illustrating an exemplary configuration of a communication apparatus 200 according to one embodiment of the present invention. In FIG. 12, the communication apparatus 200 includes a transmission circuit 210, a reception circuit 220, an antenna duplexer 230, and an antenna 240. The transmission circuit 210 corresponds to the transmission circuit 1 as described above. The antenna duplexer 230 transmits, to the antenna 240, a transmission signal outputted from the transmission circuit 210, so as to prevent the transmission signal from being leaked to the reception circuit 220. On the other hand, the antenna duplexer 230 transmits, to the reception circuit 220, a reception signal inputted from the antenna 240, so as to prevent the reception signal from being leaked to the transmission circuit 210.

Therefore, the transmission signal is outputted from the transmission circuit 210, and emitted into a space from the antenna 240 through the antenna duplexer 230. The reception signal is received by the antenna 240, and received by the reception circuit 220 through the antenna duplexer 230.

The communication apparatus 200 in which the transmission circuit 1 as described above is used is capable of securing linearity of a transmission signal, and acting as a wireless apparatus in which distortion is reduced. Further, the transmission circuit 210 does not have a branch circuit, such as a directional coupler, for changing a direction of the output, so that generation of a loss can be reduced from the transmission circuit 210 to the antenna 240 and power consumption for the transmission can be reduced, thereby enabling the communication apparatus 200 to be used as a wireless communication apparatus for a long time period. The communication apparatus 200 may include the transmission circuit 210 and the antenna 240 without incorporating therein the reception circuit 220 and the antenna duplexer 230.

While the invention has been described in detail, the foregoing description is in all aspects illustrative and not restrictive. It is understood that numerous other modifications and variations can be devised without departing from the scope of the invention.

What is claimed is:

1. A transmission circuit for generating a transmission signal based on inputted data, and outputting the transmission signal, the transmission circuit comprising:
    a signal generation section operable to generate an amplitude signal and one of a frequency signal and a phase signal, based on an amplitude component and a phase component, respectively, both of which are obtained through signal processing of the inputted data;
    an angle modulation section operable to perform angle modulation of the one of the frequency signal and the phase signal;
    a delay time adjustment section operable to adjust a delay time of the amplitude signal;
    an amplitude amplification section operable to output a signal based on a magnitude of the amplitude signal having the delay time adjusted;
    an amplitude modulation section operable to amplitude-modulate a signal outputted by the angle modulation section, by the signal outputted by the amplitude amplification section, and output an obtained signal as a modulated signal; and
    a delay processing circuit operable to calculate a delay time difference between the amplitude signal and the one of the frequency signal and the phase signal, based on the modulated signal, and to perform feedback control for the delay time which is to be adjusted by the delay time adjustment section such that the delay time difference is reduced, during only a predetermined test period,
    wherein the signal generation section outputs a sinusoidal signal as the amplitude signal and a sinusoidal signal as the one of the frequency signal and the phase signal during the predetermined test period, and
    wherein when $\omega_m$ represents an angular frequency of a sinusoidal signal, $\omega_0$ represents an angular frequency of a carrier signal, and A, B, $\alpha$, and $\beta_0$ each represent a constant, the signal generation section outputs, as the amplitude signal, a sinusoidal signal obtained through equation [1], and outputs, as the frequency signal, a sinusoidal signal obtained through equation [2], $$A(1+\alpha \cos \omega_m t) \qquad \text{equation [1], and}$$

$$B(\omega_0+\beta_0 \cos \omega_m t) \qquad \text{equation [2].}$$

2. The transmission circuit according to claim 1, wherein the angular frequency $\omega_m$ is a value that prevents the sinusoidal signal of the amplitude signal and the sinusoidal signal of the one of the frequency signal and the phase signal from being attenuated in paths from the signal generation section to the amplitude modulation section.

3. The transmission circuit according to claim 2, wherein the signal generation section outputs the sinusoidal signals indicative of a lesser value at the angular frequency $\omega_m$, and the sinusoidal signals indicative of a greater value at the angular frequency $\omega_m$.

4. The transmission circuit according to claim 1, wherein when A, B, $\alpha$, and $\beta_0$ are each set such that a level of a sideband wave is minimized at an angular frequency $\omega_0-\omega_m$ of the transmission signal or at an angular frequency $\omega_0+\omega_m$ of the transmission signal when the delay time difference between the amplitude signal and the frequency signal is zero.

5. The transmission circuit according to claim 1, wherein the amplitude amplification section is a series regulator.

6. The transmission circuit according to claim 1, wherein the amplitude amplification section is a switching regulator.

7. The transmission circuit according to claim 1, wherein the predetermined test period includes one of at least a time period immediately after the transmission circuit is powered on, and a time period before data transmission is really started.

8. A communication apparatus, comprising:
the transmission circuit according to claim 1 operable to generate the transmission signal; and
an antenna operable to output the transmission signal generated by the transmission circuit.

9. The communication apparatus according to claim 8, further comprising:
a reception circuit operable to process a reception signal received from the antenna; and
an antenna duplexer operable to output, to the antenna, the transmission signal generated by the transmission circuit, and output, to the reception circuit, the reception signal received from the antenna.

10. A method, performed by a transmission circuit that processes inputted data separately as an amplitude component signal and a phase component signal, for determining a delay time to be used for adjusting the amplitude component signal, the method comprising:
inputting, to the transmission circuit, a first sinusoidal signal as the amplitude component signal, and a second sinusoidal signal as the phase component signal, during a predetermined test period;
adjusting the first sinusoidal signal by using the delay time having been determined, and amplifying the first sinusoidal signal having been adjusted;
angle-modulating the second sinusoidal signal;
amplitude-modulating the second sinusoidal signal having been angle-modulated, by the first sinusoidal signal having been amplified;
calculating a delay time difference between the first sinusoidal signal and the second sinusoidal signal based on a signal obtained through the amplitude-modulating; and
determining a delay time obtained when the delay time difference is minimized, as the delay time which is used for adjusting the amplitude component signal,
wherein when $\omega_m$ represents an angular frequency of a sinusoidal signal, $\omega_0$ represents an angular frequency of a carrier signal, and A, B, $\alpha$, and $\beta_0$ each represent a constant, the first sinusoidal signal is obtained through equation [1], and the second sinusoidal signal is obtained through equation [2], $$A(1+\alpha \cos \omega_m t) \qquad \text{equation [1], and}$$

$$B(\omega_0+\beta_0 \cos \omega_m t) \qquad \text{equation [2].}$$

* * * * *